US008742795B2

(12) United States Patent
Terashima (10) Patent No.: US 8,742,795 B2
(45) Date of Patent: Jun. 3, 2014

(54) FREQUENCY DIFFERENCE CALCULATION CIRCUIT, A SATELLITE SIGNAL RECEIVING APPARATUS AND FREQUENCY DIFFERENCE CALCULATION METHOD

(71) Applicant: Seiko Epson Corporation, Tokyo (JP)

(72) Inventor: Maho Terashima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/800,238

(22) Filed: Mar. 13, 2013

(65) Prior Publication Data

US 2013/0241598 A1  Sep. 19, 2013

(30) Foreign Application Priority Data

Mar. 19, 2012 (JP) ................................. 2012-062723

(51) Int. Cl.
*H03L 7/087* (2006.01)
(52) U.S. Cl.
CPC ...................................... *H03L 7/087* (2013.01)
USPC ............................................. 327/42; 327/40
(58) Field of Classification Search
CPC ............ G06F 1/04; H03B 21/02; H03L 7/087
USPC ........... 327/40, 39, 41, 42, 43, 44, 46, 47, 48, 327/49
See application file for complete search history.

(56) References Cited

U.S. PATENT DOCUMENTS

| 5,521,948 A | * | 5/1996 | Takeuchi ....................... 375/376 |
| 6,473,030 B1 | | 10/2002 | McBurney et al. | |
| 2004/0151271 A1 | * | 8/2004 | Krueger et al. ................ 375/376 |

FOREIGN PATENT DOCUMENTS

| JP | 2002-357652 A | 12/2002 |
| JP | 2011-199481 A | 10/2011 |

\* cited by examiner

*Primary Examiner* — Lincoln Donovan
*Assistant Examiner* — Jung H Kim
(74) *Attorney, Agent, or Firm* — Kilpatrick Townsend & Stockton LLP (57) ABSTRACT

In a frequency difference calculation circuit, a first frequency difference calculation section calculates a difference between the first input frequency and an oscillation frequency of the non-integer multiple oscillation section of which an oscillation frequency is a non-integer multiple of the first input frequency. Meanwhile, a second frequency difference calculation section calculates a difference between a second input frequency in which a difference between frequency having an integer multiple of the first input frequency and the second input frequency being within a predetermined error range, and the oscillation frequency of the non-integer multiple oscillation section and an addition section calculates a difference between the first input frequency and the second input frequency adding a calculation result of the first calculation section and a calculation result of the second calculation section.

7 Claims, 6 Drawing Sheets

FREQUENCY DIFFERENCE CALCULATION CIRCUIT, A SATELLITE SIGNAL RECEIVING APPARATUS AND FREQUENCY DIFFERENCE CALCULATION METHOD

This application claims priority to Japanese Patent Application No. 2012-062723, filed Mar. 19, 2012, the entirety of which is hereby incorporated by reference.

BACKGROUND

1. Technical Field

The present invention relates to a circuit for calculating a difference between a first input frequency and a second input frequency.

2. Related Art

Figure 6:
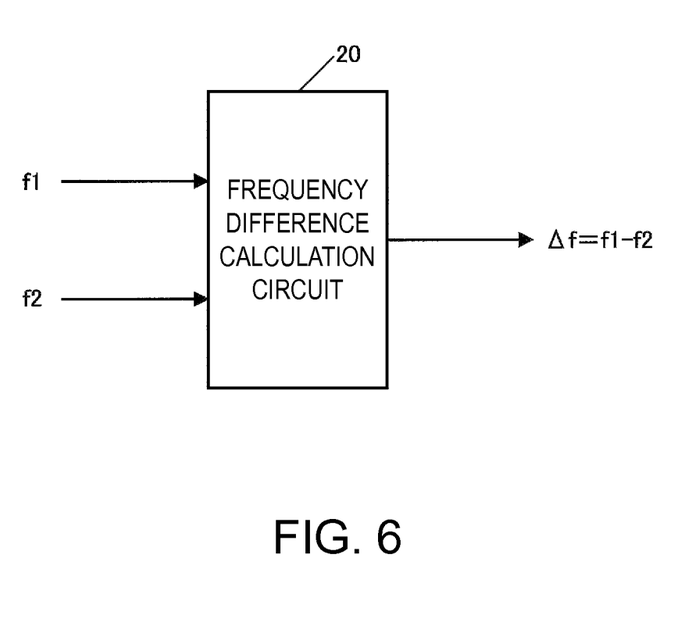
FIG. 6 is an example of a frequency difference calculation circuit of the related art.

In the related art, a frequency difference calculation circuit 20 is to calculate and output a difference between a first input frequency f1 and a second input frequency f2 as illustrated in FIG. 6. Such a frequency difference calculation circuit 20 has various applications. For example, the applications include an application of a phase-locked loop (PLL) for tracking a received signal and an application for adjusting an oscillation frequency of an oscillator having a low-precision to an oscillation frequency of an oscillator having a high-precision (for example, JP-A-2002-357652 and JP-A-2011-199481).

However, there has been a problem in a frequency difference operation circuit 20 of the related art. This problem occurs in a case where two input frequencies to be compared have a relationship of being an integer multiple, or a relationship that may be regarded as being a substantial integer multiple.

Figure 7:
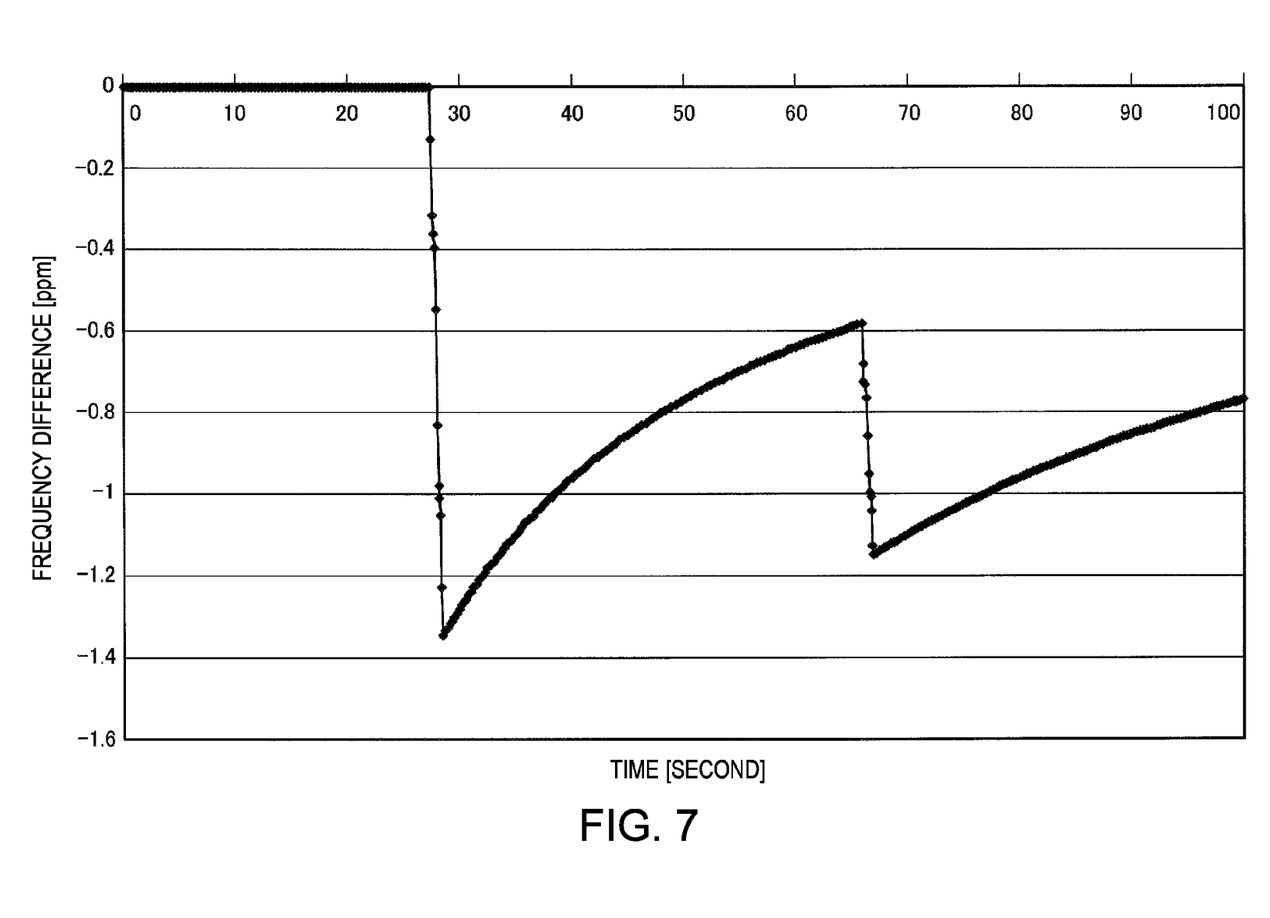
FIG. 7 illustrates an experimental result of a frequency difference calculation circuit of the related art.

FIG. 7 is a view illustrating an example of experimental results obtained by calculating a difference between oscillation frequencies of two kinds of oscillator in a frequency difference calculation circuit 20 of the related art. The oscillation frequencies of the two kinds of the oscillator were adjusted to be approximately equal. In FIG. 7, the horizontal axis is a time axis (units are seconds) and the vertical axis is a frequency difference (units are ppm (parts per million)). At each calculation time, frequency differences obtained by calculating prior to the calculation time are cumulatively averaged and the cumulative average values plotted in a time series and are connected by a solid line. A true value of the frequency difference is "−1 ppm".

As can be seen from the results of this experiment, the problem with the frequency difference calculation circuit 20 of the related art is in the time necessary for the outputs of the frequency differences to converge. If the calculation is performed for more than a certain period of time, the outputs of the frequency differences converge to a correct value, but a considerable time to convergence of the outputs of the frequency differences to the correct value is required. In the experiment in FIG. 7, the outputs of the frequency differences have not converged to a correct frequency difference even after the lapse of 100 seconds.

SUMMARY

An advantage of some aspects of the invention is to provide a frequency difference calculation circuit capable of quickly calculating a correct frequency difference.

A first aspect of the invention is directed to a frequency difference calculation circuit including: an oscillation section of which an oscillation frequency is a non-integer multiple of a first input frequency; a first calculation section that calculates a difference between the first input frequency and the oscillation frequency of the oscillation section; a second calculation section that calculates a difference between a second input frequency and the oscillation frequency of the oscillation section, a difference between frequencies which have an integer multiple of the first input frequency and the second input frequency being within a predetermined error range; and a third calculation section that calculates a difference between the first input frequency and the second input frequency using a calculation result of the first calculation section and a calculation result of the second calculation section.

As another aspect, the invention may be configured as a frequency difference calculation method including: a first calculation in which a difference between a first input frequency and an oscillation frequency of an oscillation section is calculated, the oscillation frequency being a non-integer multiple of the first input frequency; a second calculation in which a difference between a second input frequency and the oscillation frequency of the oscillation section is calculated, a difference between frequencies which have an integer multiple of the first input frequency and the second input frequency being within a predetermined error range; and a third calculation in which a difference between the first input frequency and the second input frequency is calculated using a calculation result of the first calculation and a calculation result of the second calculation.

According to the first aspect or the like of the invention, a first calculation is performed to calculate a difference between a first input frequency and an oscillation frequency of an oscillation section of which an oscillation frequency is a non-integer multiple of the first input frequency. Further, a second calculation is performed to calculate a difference between a second input frequency and the oscillation frequency of the oscillation section, a difference between an integer multiple of the first input frequency and the second input frequency being within a predetermined error range. Furthermore, a third calculation is performed to calculate a difference between the first input frequency and the second input frequency using the calculation result of the first calculation and the calculation result of the second calculation. It is possible to quickly calculate a correct frequency difference between a first input frequency and a second input frequency through an oscillation frequency of an oscillation section in which the oscillation frequency is a non-integer multiple of the first input frequency.

As a second aspect of the invention, the frequency difference calculation circuit according to the first aspect of the invention may be configured such that the oscillation section includes a ring oscillator.

According to the second aspect, it is possible to provide a circuit which easily produces the oscillation frequency of the non-integer multiple of the first input frequency.

As a third aspect of the invention, the frequency difference calculation circuit according to the second aspect of the invention may be configured such that the ring oscillator is configured of a complementary metal oxide semiconductor (CMOS) circuit, and the frequency difference calculation circuit is configured by one chip.

According to the third aspect, it is possible to configure the frequency difference calculation circuit as a digital circuit on one chip by configuring a CMOS circuit as the ring oscillator.

As a fourth aspect of the invention, the frequency difference calculation circuit according to any of the first to third aspects of the invention may be configured such that the third calculation section calculates the difference between the first input frequency and the second input frequency by adding the calculation result of the first calculation section and the calculation result of the second calculation section.

According to the fourth aspect, it is possible to configure the third calculation section as a simple circuit.

As a fifth aspects of the invention, the frequency difference calculation circuit according to any of the first to fourth aspects of the invention may be configured such that the first input frequency and the second input frequency may be oscillation frequencies of oscillators having different temperature dependencies, respectively.

A sixth aspect of the invention is directed to a satellite signal receiving apparatus including the frequency difference calculation circuit according to nay of the first to fifth aspects of the invention.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. Verification of Frequency Difference Calculation Circuit of Related Art

Figure 1:
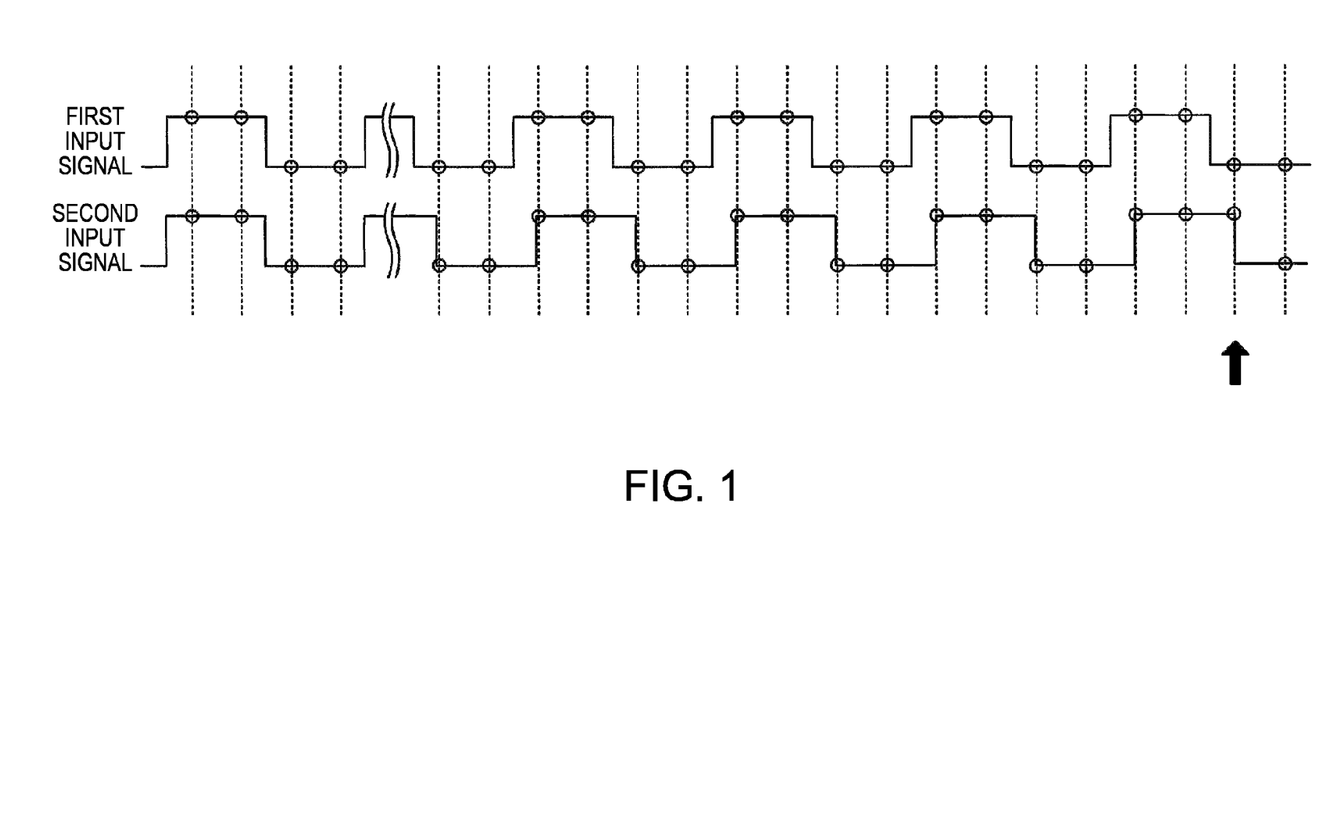
FIG. 1 is a view illustrating a principle of a frequency difference calculation circuit of the related art.

Firstly, the reason why the experimental results shown in FIG. 7 were obtained will be considered. FIG. 1 is a view illustrating a principle of a frequency difference calculation circuit 20 of the related art. FIG. 1 illustrates a relationship between waveforms and sample values of two input signals, frequencies of which are substantially identical. In order to simplify the explanation, FIG. 1 is a view selecting the two input signals as an ideal square wave and illustrates a case where the sample is obtained at a frequency of 4 times the input signal. Of course, a sampling frequency may be 4 times or more in practice and the waveform of the input signal also is not limited to an ideal square wave.

The frequency difference calculation circuit 20 of the related art samples the input signal at predetermined intervals and the frequency difference is calculated from the difference between the sample values and the sampling intervals. In FIG. 1, dotted lines parallel to the vertical axis illustrate sample timing, and the sample values at each sample timing are shown as white circles from which plots of the waveforms of the input signals are superimposed.

For example, in FIG. 1, a first input signal and a second input signal have only a difference of a degree of error and thus have a substantially equal frequency. Therefore, it is considered that if the two input signals are sampled at the same sampling timing, a difference between the sample values does not occur because values of a substantially equal portion of the square wave are sampled.

However, the frequency of the first input signal is not identical to the frequency of the second input signal. For this reason, if the two input signals are sampled in a time series, phases of the two input signals gradually deviate by a slight difference of a degree of error between the frequencies and different sample values are obtained at the sampling timing of a black arrow in the drawings in which the deviation of the phases exceeds the sampling intervals.

The experimental result in FIG. 7 illustrates an event similar to an event illustrated in FIG. 1. That is, in FIG. 7, the difference between the sample values of the two input signals does not occur from a start of a calculation to about 27 seconds as in the state before the black arrow in FIG. 1, and it is determined that the frequency deviation is zero. The frequency difference which each plot in FIG. 7 illustrates is the result such that the calculation results (frequency difference) prior to the plot are cumulatively averaged. Since the difference between the sample values of two input signals does not occur from the start of the calculation to about 27 seconds, the cumulative average value of the frequency difference is maintained at zero.

However, at the time of about 27 seconds, a difference between sample values is generated as illustrated in the black arrows in FIG. 1. That is, the difference between sample values of two input signals is generated because the deviation of the phase of two input signals exceeds the sampling intervals. Since the frequency difference caused by the difference of the sample value is added to the previous calculation result, the values that widely deviate from the previous calculation result are obtained and thus the frequency difference is significantly changed.

In addition, in FIG. 7, a plurality of plots can be seen during a change of the frequency difference at the time of about 27 seconds. However, the plots are caused by the fact that the input signal is not an ideal square wave or the sampling frequency is high and the like.

At the time of about 27 seconds, since an instantaneous difference between the samples values of the two input signals is generated, the frequency difference exceeds the true value and changes greatly. After that, a period at which the sample value again becomes the same value is continuous during a certain period. More specifically, the period from about 27 seconds to about 68 seconds in FIG. 7 corresponds to a period at which the deviation of the phase of the two input signals exceeds the next sampling interval. That is, a difference between the sample values of the two input signals is not generated in this period. For this reason, the cumulative average value of the previous calculation result tends to converge slowly. In FIG. 7, the frequency difference is slowly changed (change in the positive direction) from the plot of the time of about 27 seconds to the plot of the time of about 68 seconds.

However, since the deviation of the phase of the two input signals again exceeds the sample interval at the time of about 68 seconds, the result of the calculation changes greatly. The experimental result in FIG. 7 is repeated.

In addition, the frequency of the first input signal and the frequency of the second input signal have been described with respect to a frequency of one time, that is, a substantially equal frequency, but is identical even for an integer multiple of two times or more.

2. Frequency Difference Calculation Circuit of Embodiment

Figure 2:
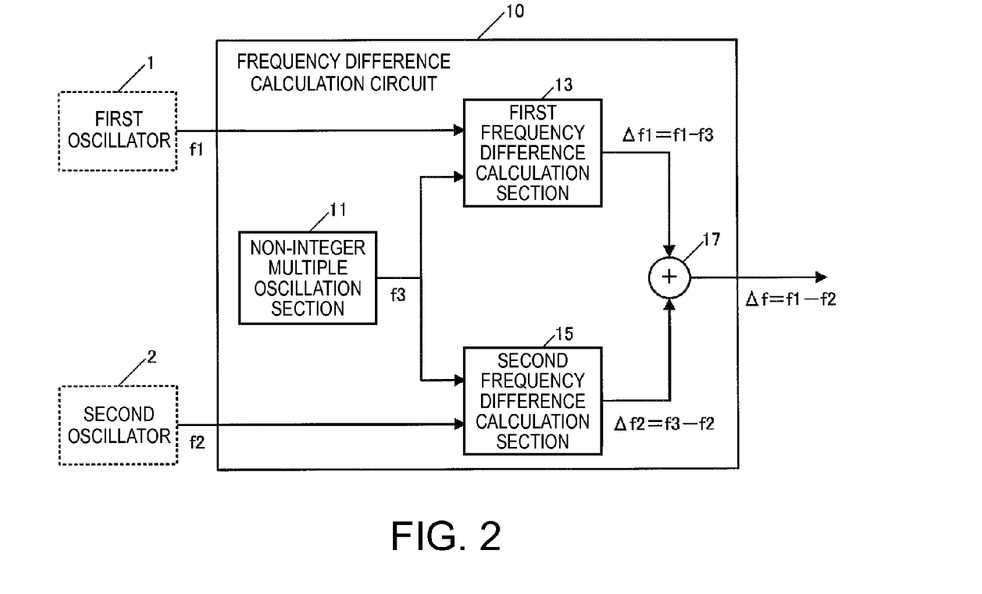
FIG. 2 is an example of a circuit configuration of a frequency difference calculation circuit of an embodiment.

Next, the frequency difference calculation circuit and the frequency difference calculation method of an embodiment will be described. FIG. 2 is a view illustrating one example of a circuit configuration of the frequency difference calculation circuit 10 of the embodiment. The frequency difference calculation circuit 10 includes a non-integer multiple oscillation section 11, a first frequency difference calculation section 13, a second frequency difference calculation section 15 and an addition section 17.

The first input signal having the first input frequency f1 and the second input signal having the second input frequency f2 are input to the frequency difference calculation circuit 10. The first input signal and the second input signal may be any signal, but for example, may be set as the oscillation signal of the different oscillators.

It can be considered that the oscillator is an oscillator including a temperature compensated crystal oscillator (TCXO) or a voltage controlled oscillator (VCO), a voltage controlled crystal oscillator, an oven controlled crystal oscillator (OCXO) and a real time clock (RTC).

Actually, when the oscillation frequencies of the two oscillators are input, the two oscillators may be an oscillator having different temperature dependence. In other words, the oscillators have the temperature characteristics. Therefore, the circuit using the frequency of one oscillator uses the frequency of the other oscillator as a standard frequency (reference frequency) in order to compensate for the accuracy of the frequency of one oscillator. The frequency difference calculation circuit 10 of the embodiment is applicable to the circuit.

In the embodiment, the second input frequency f2 becomes a frequency in which the difference between frequency that is an integer multiple of the first input frequency f1 and the second input frequency f2 is in a predetermined error range. The predetermined error range means a numerical range represented by a degree of the frequency regarded as the error in consideration of orders of the input frequency. For example, this range has the difference between 0% to 5%.

Figure 3:
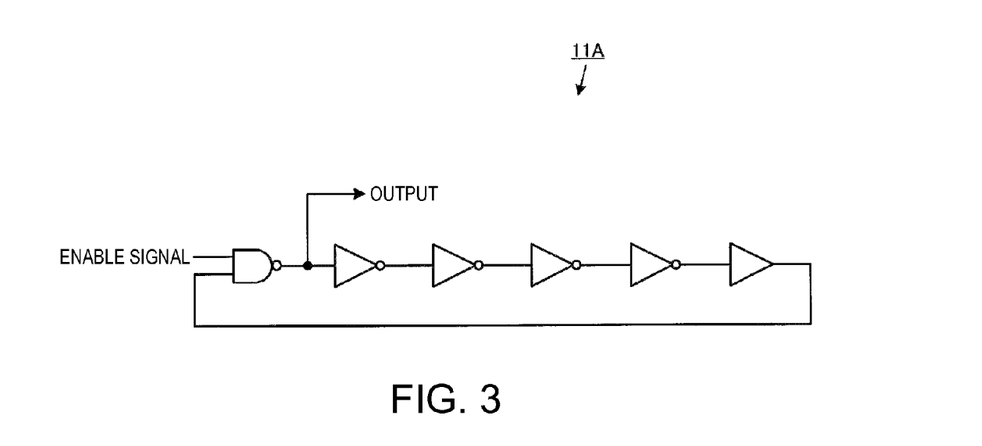
FIG. 3 is an example of a circuit configuration of a ring oscillator of an embodiment.

The non-integer multiple oscillation section 11 is an oscillator section which oscillates at the oscillation frequency f3 which is a non-integer multiple of the first input frequency f1. In the embodiment, the non-integer multiple oscillation section 11 includes a ring oscillator 11A. The ring oscillator 11A, for example, is constructed by using a plurality of inverters as illustrated in FIG. 3.

The oscillation frequency of the ring oscillator 11A is determined by the number of stages and a delay time per one stage of inverters. Therefore, the ring oscillator 11A is designed for the oscillation frequency to become the non-integer multiple of the first input frequency f1 and outputs the oscillation signal of the oscillation frequency f3 of the non-integer multiple of the first input frequency f1 while an enable signal is input. The enable signal may be input as a signal for a calculation instruction from the outside and a circuit may be incorporated which smoothes the first input signal or the second input signal to generate an enable signal.

In addition, it is possible for the ring oscillator 11A to include a plurality of stages of NAND circuit and the like, not a plurality of stages of inverters. In any case, because the non-integer multiple oscillation circuit 11 includes a logical calculation circuit, it is possible for the non-integer multiple oscillation circuit 11 to include a CMOS circuit. Therefore, the frequency difference calculation circuit 10 including the non-integer multiple oscillation section 11 can be configured by one chip.

Returning to FIG. 2, the first frequency difference calculation section 13 is an operator for calculating the frequency difference (hereinafter, referred to as "a first frequency difference") between a first input frequency f1 and an oscillation frequency f3 of the non-integer multiple oscillation section 11, that is, "Δf1=f1−f3" and is configured to have a frequency counter and a frequency comparator.

The second frequency difference calculation section 15 is an operator for calculating a frequency difference between the oscillation frequency f3 of the non-integer multiple oscillation section 11 and the second input frequency f2 (hereinafter, referred to as "second frequency difference"), that is, "Δf2=f3−f2" and is configured to have a frequency counter and a frequency comparator. The first frequency difference calculation section 13 and the second frequency difference calculation section 15 can be configured using the frequency difference calculation circuit 20 of the related art.

The addition section 17 is an addition section for adding a first frequency difference Δf1 calculated by the first frequency difference calculation section 13 and a second frequency difference Δf2 calculated by the second frequency difference calculation section 15. The addition result is a difference between the first input frequency f1 and the second input frequency f2, that is, "Δf=Δf1+Δf2=f1−f2" and the addition result becomes an output of the frequency difference calculation circuit 10. The addition section 17 corresponds to a third calculation section.

3. Experimental Result

Figure 4:
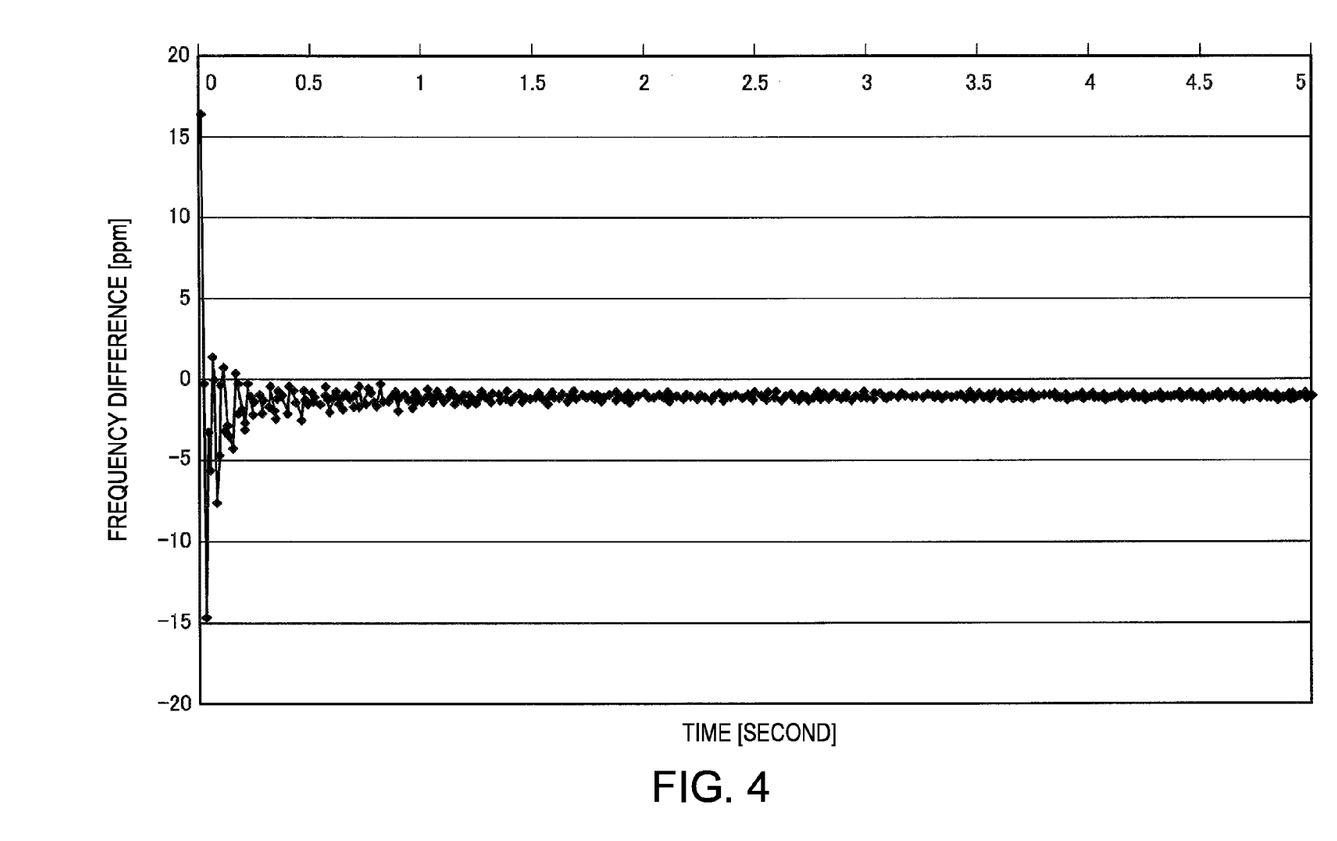
FIG. 4 illustrates an experimental result of a frequency difference calculation circuit of an embodiment.

The experimental result of the frequency difference calculation circuit 10 will be described. FIG. 4 is a view illustrating an example of the experimental result of the frequency difference calculation circuit 10. The way of understanding FIG. 4 is identical to that of FIG. 7 and a true value of the frequency difference is "−1 ppm". As can be seen from FIG. 4, the frequency difference vertically fluctuates to a degree of an initial 0.2 seconds, but converges to the true value "−1 ppm" from the start of a calculation and at the elapsed time of about one second.

Figure 5:
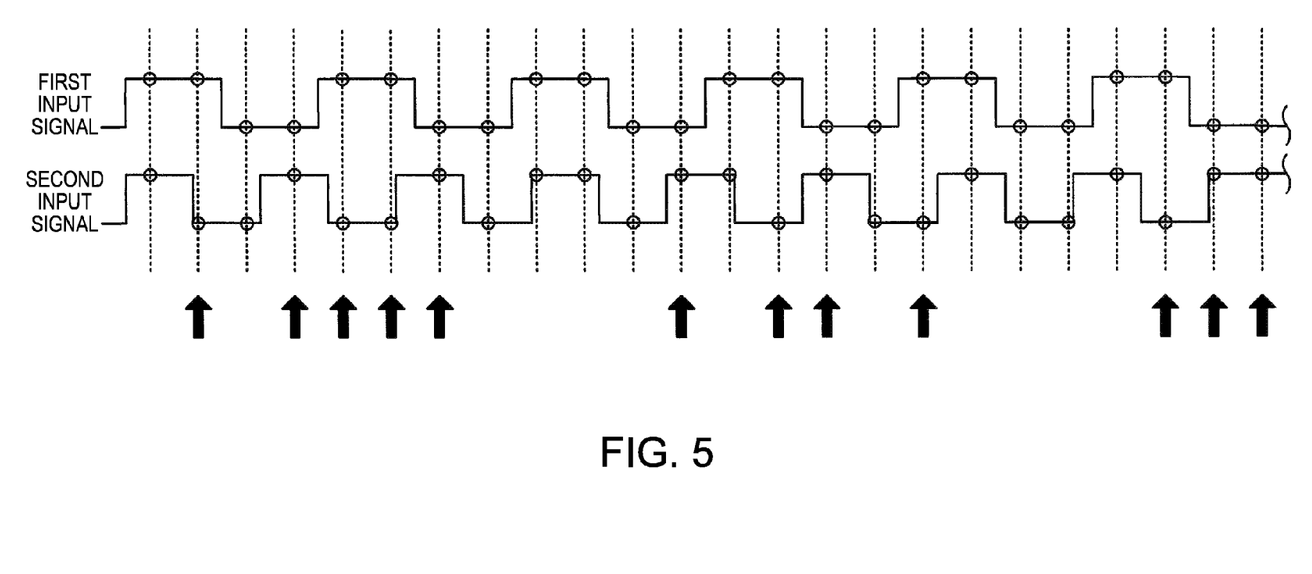
FIG. 5 is a view illustrating a principle of a frequency difference calculation circuit of an embodiment.

FIG. 4 illustrates a reason why experimental result is obtained. FIG. 5 is a view illustrating a relationship between the waveform of two input signals of which the frequencies have a relationship of the non-integer multiple and the sample value. The way of understanding the drawings is identical to that of FIG. 1 and illustrates view of a case where the two input signal are sampled at the frequency of about 4 times of the first input signal. The frequency of the second input signal is approximately 1.5 times of the frequency of the first input signal and the sample value shows the black arrows at the sample timing at which the sample values are different from each other.

Referring to FIG. 5, FIG. 5 is different from FIG. 1 and different sample values appear with high frequency. Therefore, the frequency difference is greatly changed immediately after the start of the calculation as illustrated in FIG. 4. However, since the frequency of appearance of the different sample values is almost constant, the calculation is progressed to settle down the cumulative average value of the frequency difference. Herein, it should be noted that even in FIG. 1, as illustrated in FIG. 7, since the calculation is progressed so that the frequency difference is gradually converged, the frequency of the appearance of the different sample values is almost constant. The difference is the frequency of the appearance of the different sample value. In FIG. 1, since the frequency of the appearance is very low, a long time necessary to converge is required (see FIG. 7). On the other hand, in FIG. 5, since the frequency of appearance is high, a short time necessary to converge is required (see FIG. 4).

The frequency difference calculation circuit 10 is a circuit configured by combining the frequency difference calculation section (the first frequency calculation section 13 and the second frequency difference calculation section 15) that calculates the frequency difference of the two input signals in which the frequency has the relationship of the non-integer multiple. Therefore, the frequency difference calculation circuit 10 as a whole makes the correct frequency difference quick.

4. Operating Effect

In the frequency difference calculation circuit 10, the first frequency difference calculation section 13 calculates a difference between the first input frequency f1 and the oscillation frequency f3 of the non-integer multiple oscillation section 11 in which the oscillation frequency is a non-integer multiple of the first input frequency f1. Meanwhile, the second frequency difference calculation section 15 calculates a difference between the second input frequency f2 in which a difference between frequency having integer multiple of the first input frequency f1 and the second input frequency f2 is in a predetermined error range and the oscillation frequency f3 of the non-integer multiple oscillation section 11. In addition, the addition section 17 calculates the difference between the first input frequency f1 and the second input frequency f2, that is, "Δf=f1-f2" by adding the calculation result of the first frequency difference calculation section 13 and the second frequency difference calculation section 15.

There is a case where the oscillator in which the nominal frequencies are equal to each other or the oscillator in which the nominal frequencies have the relationship of the integer multiple of each other is incorporated into the electronic apparatus in order to perform a signal process. In this case, when the difference between the oscillation frequencies of the oscillators is calculated by a simple subtraction, there is a concern that the calculation accuracy of the frequency difference is reduced.

However, the frequency difference calculation circuit 10 provides the non-multiple oscillation section 11 in which the oscillation frequency is a non-integer multiple of the first input frequency f1 and calculates the difference between the first input frequency f1 and the second input frequency f2 via the oscillation frequency of the non-integer multiple oscillation section 11. This make it possible to obtain the operating effect such as calculating the difference of the two input frequency as if having the relation of the non-integer multiple and thus it is possible to calculate the correct frequency quickly.

In addition, for example, the non-integer multiple oscillation section 11 is configured to have the ring oscillator 11A. The ring oscillator makes the generation of the oscillation signal of a desired oscillation frequency possible by adjusting the number of the stages of the inverter and the time delay. Therefore, since the non-integer multiple oscillation section 11 is configured to have the ring oscillator, it is possible to easily produce the oscillation frequency of the non-integer multiple of the first input frequency f1.

By configuring the ring oscillator 11A by the CMOS circuit, it is possible to configure the frequency difference calculation circuit 10 as the logic circuit with single chip and reduce the circuit scale as the entire electronic circuit.

5. Application Example

The frequency difference calculation circuit 10 in FIG. 2 can configure a satellite signal receiving apparatus of a global positioning system (GPS) and the like. For example, when a mobile phone is considered as an electronic apparatus providing the GPS receiver, a TCXO incorporated into the GPS receiver is set to a master clock and a VCO provided in a wireless communication circuit of the mobile phone is set to the reference clock. In addition, the frequency difference calculation circuit 10 is configured to calculate the difference between an oscillation frequency of the TCXO and an oscillation frequency of the VCO (oscillation frequency difference). In addition, in this case, it is possible to configure the frequency difference calculation circuit 10 as a circuit of an electronic apparatus.

6. Modification Example

The embodiment to which the invention is applicable is not limited to the above-mentioned embodiment and can be appropriately modified without departing from the scope of the invention. The modification example will be described below.

6-1. Calculation of Frequency Difference

In the above embodiment, the first frequency difference calculation section 13 calculates a first frequency difference Δf1 by subtracting the oscillation frequency f3 of the non-integer multiple oscillation section 11 from a first input frequency f1, but may calculate a first input frequency difference Δf1 by subtracting the first input frequency f1 from the oscillation frequency f3. It is described in the same way as the above with respect to the second frequency difference calculation section 15.

In this case, according to a calculation method of a frequency difference, the difference between the first input frequency f1 and the second input frequency f2 may be calculated by adding or subtracting the first frequency difference Δf1 and the second frequency difference Δf2. This corresponds to that the third calculation section calculates the difference between the first input frequency and the second input frequency using the calculation result of the first calculation section and the calculation result of the second calculation section.

6-2. Non-Integer Multiple Oscillation Section

The non-integer multiple oscillation section 11 is not limited to a configuration having the ring oscillator and may be a configuration having the oscillator in which the oscillation frequency is a non-integer multiple of the first input frequency f1 and is applicable to an optional oscillator.

6-3. Oscillator

Even in the first oscillator 1 and the second oscillator 2, it is possible to apply each optional oscillator. That is, the difference between the oscillation frequency of the second oscillator 2 and a frequency having integer multiple of oscillation frequency of the first oscillator 1 may be a frequency in a predetermined error range and the type and combination of two oscillators is free.

What is claimed is:

1. A frequency difference calculation circuit comprising:
an oscillation section of which an oscillation frequency is a non-integer multiple of a first input frequency;
a first calculation section that calculates a difference between the first input frequency and the oscillation frequency of the oscillation section;
a second calculation section that calculates a difference between a second input frequency and the oscillation frequency of the oscillation section, a difference between frequency which has an integer multiple of the first input frequency and the second input frequency being within a predetermined error range; and
a third calculation section that calculates a difference between the first input frequency and the second input frequency using a calculation result of the first calculation section and a calculation result of the second calculation section.

2. The frequency difference calculation circuit according to claim 1, wherein the oscillation section includes a ring oscillator.

3. The frequency difference calculation circuit according to claim 2, wherein the ring oscillator is configured by a complementary metal oxide semiconductor (CMOS) circuit, and wherein the frequency difference calculation circuit is configured by one chip.

4. The frequency difference calculation circuit according to claim 1, wherein the third calculation section calculates the difference between the first input frequency and the second input frequency by adding the calculation result of the first calculation section and the calculation result of the second calculation section.

5. The frequency difference calculation circuit according to claim 1, wherein the first input frequency and the second input frequency are oscillation frequencies of oscillators having different temperature dependencies, respectively.

6. A satellite signal receiving apparatus comprising the frequency difference calculation circuit according to claim 1.

7. A frequency difference calculation method comprising:
a first calculation in which a difference between a first input frequency and an oscillation frequency of an oscillation section is calculated, the oscillation frequency being a non-integer multiple of the first input frequency;
a second calculation in which a difference between a second input frequency and the oscillation frequency of the oscillation section is calculated, a difference between frequency which has an integer multiple of the first input frequency and the second input frequency being within a predetermined error range; and
a third calculation in which a difference between the first input frequency and the second input frequency is calculated using a calculation result of the first calculation and a calculation result of the second calculation.

* * * * *